United States Patent
Kumar

(10) Patent No.: US 8,922,256 B1
(45) Date of Patent: Dec. 30, 2014

(54) SYSTEM FOR DRIVING CURRENT STEERING SWITCHES AND PRE-DRIVERS

(71) Applicant: STMicroelectronics International N.V., Amsterdam (NL)

(72) Inventor: Surendra Kumar, Greater Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 0 days.

(21) Appl. No.: 13/971,373

(22) Filed: Aug. 20, 2013

(51) Int. Cl.
*H03K 3/00* (2006.01)

(52) U.S. Cl.
USPC .......................................... 327/108; 327/333

(58) Field of Classification Search
USPC .................................................. 327/108, 333
See application file for complete search history.

(56) References Cited

U.S. PATENT DOCUMENTS

| | | | | |
|---|---|---|---|---|
| 6,720,805 | B1 * | 4/2004 | Haas | 327/108 |
| 7,969,195 | B1 * | 6/2011 | Fortin et al. | 326/83 |
| 8,466,982 | B2 * | 6/2013 | Liu et al. | 348/222.1 |

\* cited by examiner

*Primary Examiner* — Kenneth B. Wells
(74) *Attorney, Agent, or Firm* — Slater & Matsil, L.L.P.

(57) ABSTRACT

An apparatus includes a number of current steering switches and a power controller. A current source is coupled to the current steering switches and to the power controller. The current source is controlled to provide a first voltage to the current steering switches. The apparatus also includes a number of pre-drivers. The power controller is configured to provide a second voltage to the plurality of pre-drivers. The second voltage is dependent on the first voltage.

25 Claims, 6 Drawing Sheets

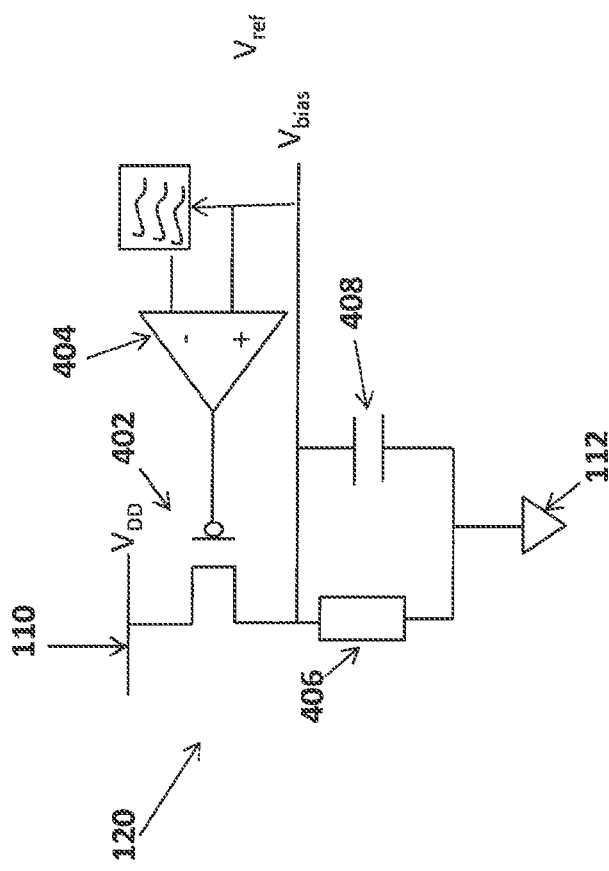
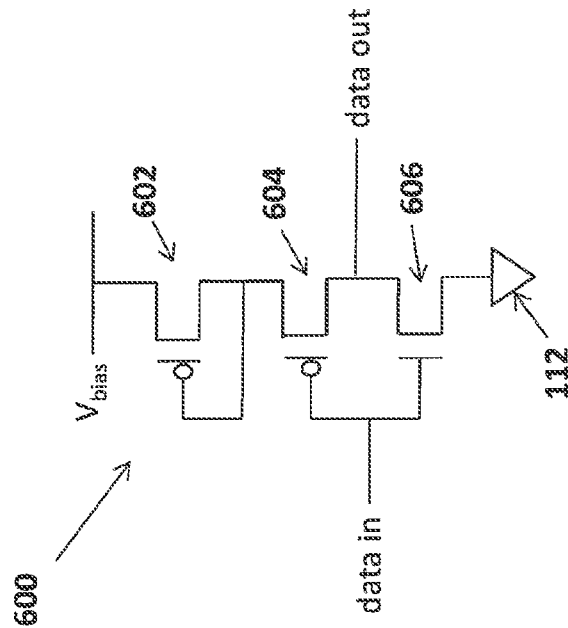

SYSTEM FOR DRIVING CURRENT STEERING SWITCHES AND PRE-DRIVERS

TECHNICAL FIELD

Some embodiments relate to transceiver methods and apparatus and in particular but not exclusively to differential signaling.

BACKGROUND

Current Mode Logic (CML) uses differential digital signaling to transmit data on chip and off chip. For example, CML may be used for transmitting data across at least one of printed circuit boards, networks on chip, and/or between dies and/or functional modules in a system on chip.

In differential signaling two complementary signals may be transmitted on paired wires. The data being transmitted is encoded into the difference between the complementary signals.

BRIEF DESCRIPTION OF THE DRAWINGS

Some embodiments will now be described, by way of example only, with reference to the Figures, in which:

FIG. 5 shows a diagram of a power control circuit in accordance with some embodiments;

FIG. 6 shows a schematic diagram of a pre-driver circuit in accordance with some embodiments.

Reference numerals refer to like elements throughout the description and accompanying figures.

DETAILED DESCRIPTION OF ILLUSTRATIVE EMBODIMENTS

Figure 1:
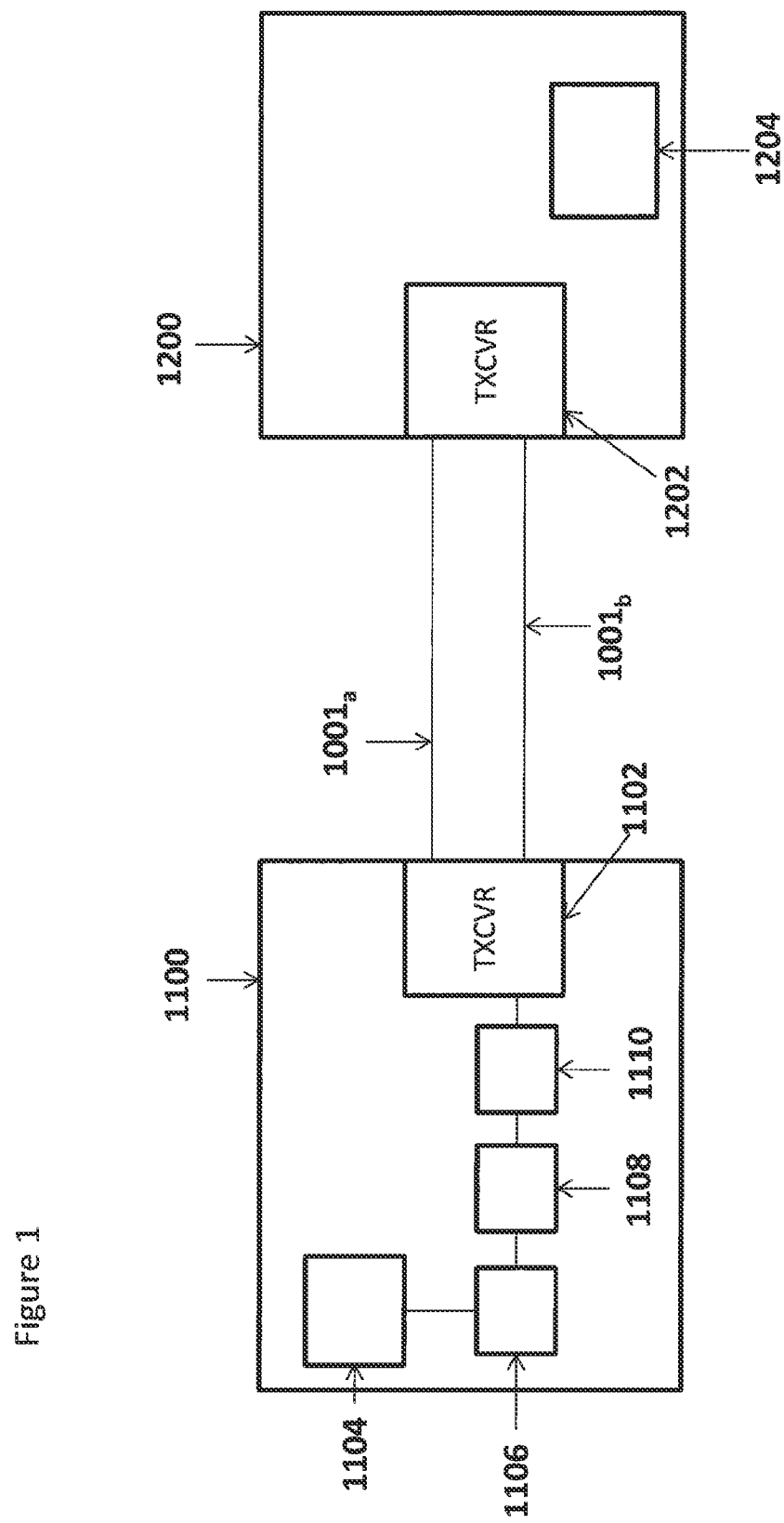
FIG. 1 shows a block diagram of a transmitter-receiver arrangement in accordance with some embodiments.

FIG. 1 shows a system comprising a first module 1100 and a second module 1200. The first module 1100 and the second module 1200 are connected by a pair of transmission lines $1001_a$, $1001_b$.

The first module 1100 further comprises at least one functional unit 1104 configured to provide an output signal to be transmitted which is received as an input by a serializer 1106. The serializer 1106 is configured to output a serialized signal which is received as an input by a synchronizer 1108. The synchronizer is configured to provide as an output a signal that is received as an input by a single ended to differential conversion stage 1110. The conversion stage 1110 is configured to provide a pair of complementary signals which is received as an input by a transceiver 1102 configured to provide as an output a differential digital signal comprising two parts. The first part of the differential digital signal is transmitted using the first of the pair of transmission lines $1001_a$ and the second part of the differential digital signal is transmitted using the second of the pair of transmission lines $1001_b$.

The second module 1200 comprises a transceiver 1202 configured to receive as an input the differential digital signal transmitted using the pair of transmission lines $1001_a$, $1001_b$. The second module 1200 further comprises at least one functional unit 1204.

In some embodiments the second module 1200 may further comprise a deconversion stage, desynchronizer and deserializer configured to process the received pair of differential digital signals and reconstruct the output signal provided by the functional unit 1104. For simplicity, these optional elements are not shown in FIG. 1.

The transceiver 1202 of the second module 1200 may be configured to transmit a differential digital signal that may be received as an input by the transceiver 1102 of the first module 1100.

In some embodiments, the first and second modules 1100, 1200 may be integrated circuits, systems on chip, network switches and/or dies. In some embodiments, the first and second modules may be the same type of module or different type of modules. In some embodiments, the functional units 1104, 1204 may be processors, memories and/or caches. In some embodiments, at least one module may comprise at least one functional unit. In some embodiments, the transmission lines may form part of at least one of a network on chip, an inter-die interface or a network on a printed wiring board.

Figure 2:
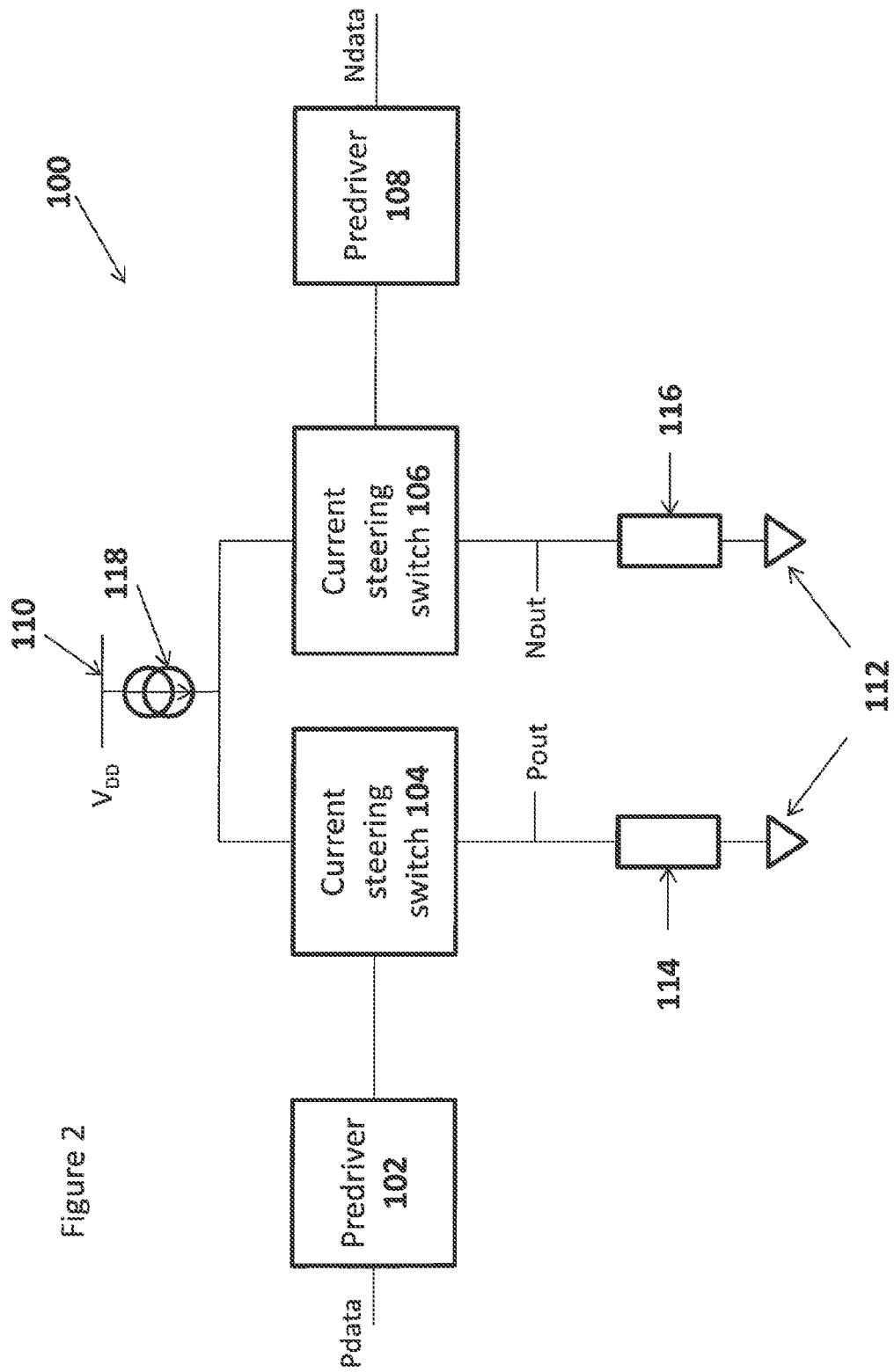
FIG. 2 shows a block diagram of a transmitter in accordance with some embodiments.

FIG. 2 shows a block diagram of a current mode logic transmitter part of the transceiver of FIG. 1 in accordance with an approach.

A first pre-driver 102 is configured to receive as an input a first of the complementary signals to be transmitted $P_{data}$. The first pre-driver 102 is configured to provide as an output a signal which is received as an input by a first current steering switch 104. A fixed voltage $V_{DD}$ 110 is configured to provide an input to a current source 118. The current source 118 is configured to provide as an output a signal which is received as an input by the first current steering switch 104. The first current steering switch is configured to provide as an output signal $P_{out}$ which may be provided to the transmission lines. The output of the first current steering switch is further received at a first terminal of a first resistor 114. The second terminal of the first resistor 114 is coupled to ground 112.

A second pre-driver 108 is configured to receive as an input a second of the complementary signals to be transmitted $N_{data}$. The second predriver 108 is configured to provide as an output a signal which is received as an input by a second current steering switch 106. The second current steering switch is further configured to receive as an input the signal provided as an output by the current source 118. The second current steering switch is configured to provide as an output a signal $N_{out}$ which may be provided to the transmission lines. The output of the second current steering switch is further received as an input at a first terminal of a second resistor 116. The second terminal of the second resistor 116 is coupled to ground 112.

The first and second pre-drivers 102, 108 are configured to buffer the respective first and second complementary signals $P_{data}$, $N_{data}$. The respective first and second current steering switches 104, 106 are configured to control the respective currents of the first and second output signals $P_{out}$, $N_{out}$.

Figure 3:
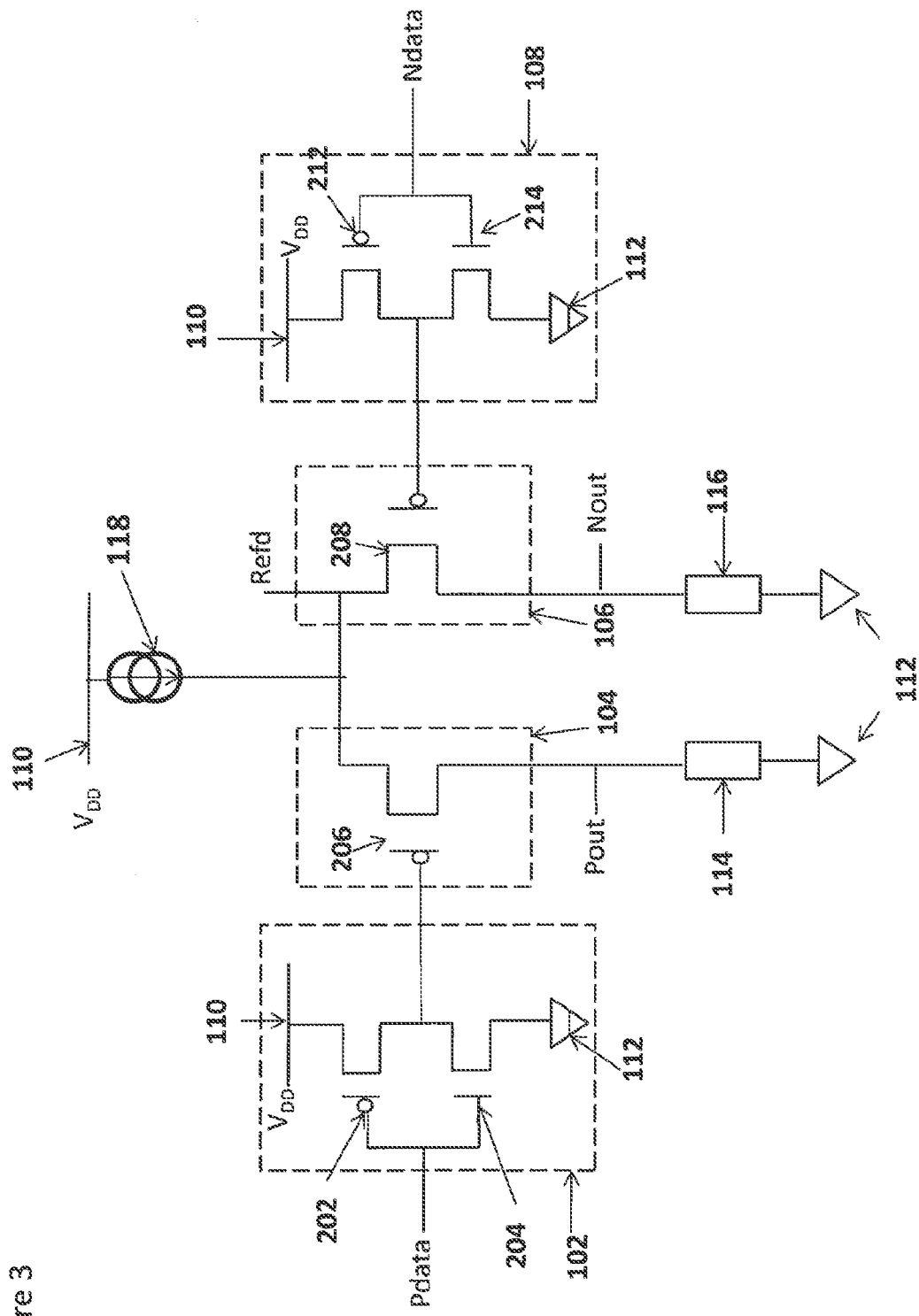
FIG. 3 shows a more detailed diagram of the transmitter of FIG. 2 in accordance with some embodiments.

FIG. 3 shows a more detailed diagram of the transmitter shown in FIG. 2.

The first pre-driver 102 comprises a first p-type transistor 202 and a second n-type transistor 204. The gates of the first and second transistors 202, 204 are configured to receive as an input the first complementary signal $P_{data}$. The source of the first transistor 202 is configured to receive the fixed voltage $V_{DD}$ 110 and the source of the second transistor 204 is coupled to ground 112. The drain of the first transistor 202 is coupled to the drain of the second transistor 204 and configured to provide as an output the output signal of the first pre-driver circuit 102.

The first and second current steering switches 104, 106 are configured to receive as an input the output provided by the current source 118. The gate of the third transistor 210 is configured to receive an enable signal EN which controls whether the transmitter transmits the data. Thus whether the fixed voltage $V_{DD}$ is provided to the current steering circuits 104, 106 is controlled by a third n-type transistor 210.

The first current steering switch 104 comprises a fourth p-type transistor 206. The source of the fourth transistor 206 is configured to receive the fixed voltage from the third transistor 210. The gate of the fourth transistor 206 is configured to receive as an input the output provided by the first pre-driver 102. The drain of the fourth transistor 206 is configured to provide as an output the output signal $P_{out}$ which is also received at the first terminal of the first resistor 114. As in FIG. 2, the second terminal of the first resistor 114 is connected to ground 112.

The second pre-driver 108 comprises a fifth p-type transistor 212 and a sixth n-type transistor 214. The gates of the fifth and sixth transistor 212, 214 are configured to receive as an input the second complementary signal $N_{data}$. The source of the fifth transistor 212 is configured to receive the fixed voltage $V_{DD}$ 110 and the source of the sixth transistor 214 is coupled to ground 112. The drain of the fifth transistor 212 is coupled to the drain of the sixth transistor 214 and configured to provide as an output the output signal of the second pre-driver circuit 108.

The second current steering switch 106 comprises a seventh p-type transistor 208. The source of the seventh transistor 208 is configured to receive the fixed voltage from the third transistor 210. The gate of the seventh transistor 208 is configured to receive as an input the output provided by the second pre-driver 108. The drain of the seventh transistor 208 is configured to provide as an output the output signal Nout which is also received at the first terminal of the second resistor 116. As in FIG. 2, the second terminal of the second resistor 116 is connected to ground 112.

Figure 4:
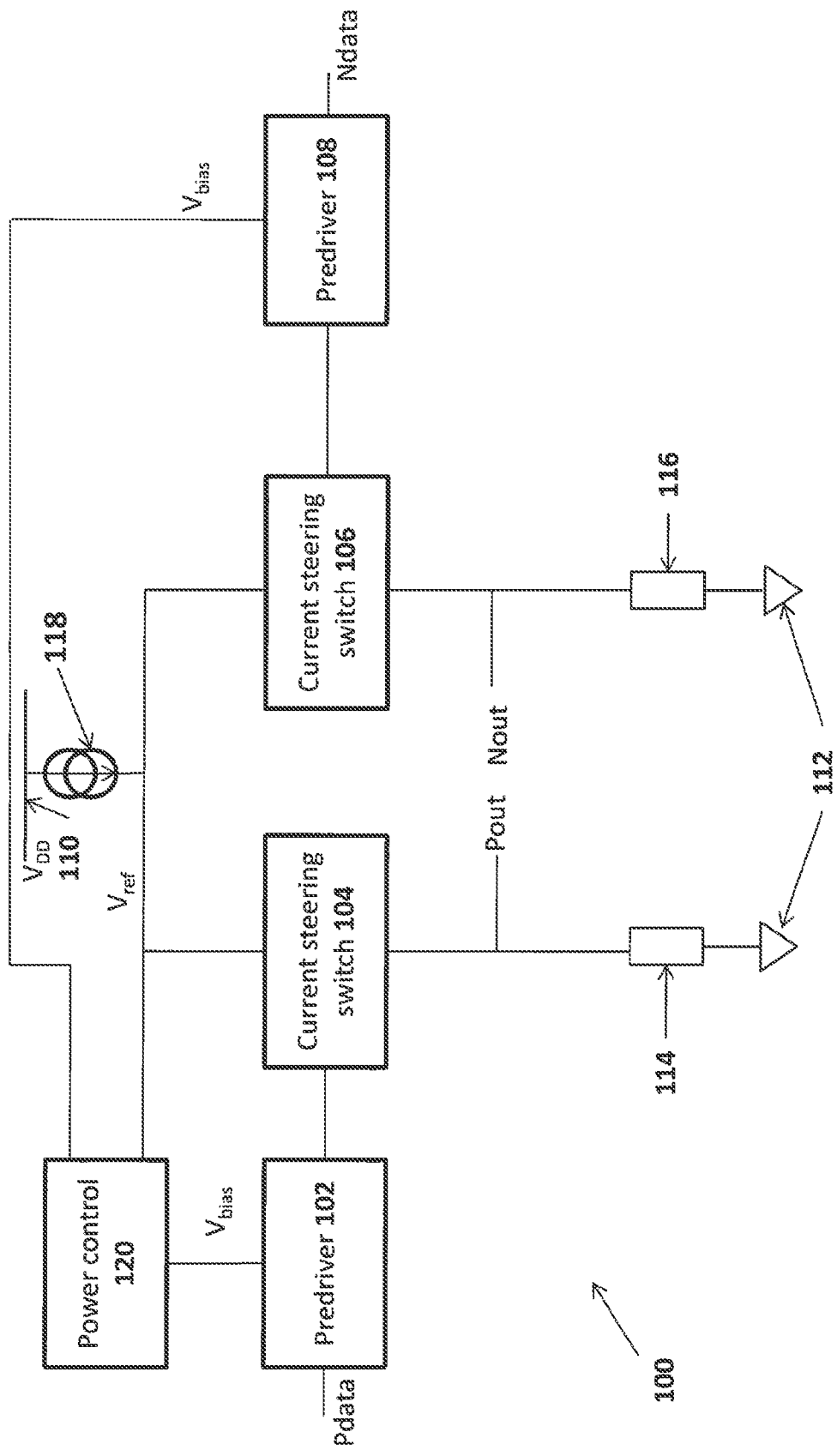
FIG. 4 shows a block diagram of a transmitter in accordance with some embodiments.

FIG. 4 shows a further block diagram of an alternative transmitter in accordance with some embodiments.

FIG. 4 comprises the elements shown in FIG. 2. FIG. 4 further comprises a power control circuit 120 configured to receive as an input the fixed voltage $V_{ref}$ received by the first and second current steering switches 104, 106. The power control circuit 120 is configured to provide as an output a bias voltage $V_{bias}$ which is received as an input by the first and second pre-drivers 102, 108.

In some embodiments, the power control circuit may regulate the voltage $V_{bias}$ provided to the pre-drivers 102, 108 such that it is dependent on the voltage $V_{ref}$ provided to the current steering switches 104, 106 by the current source 118 as explained in more detail in relation to FIG. 5.

FIG. 5 shows a more detailed diagram of the power control circuit 120 in accordance with some embodiments. The reference voltage $V_{ref}$ is received as an input by a low pass filter 410. The low pass filter is configured to provide as an output a signal which is received as an input by the inverting input of an operational amplifier 404. The operational amplifier 404 is configured to provide as an output a signal which is received as an input by the gate of an eighth p-type transistor 402. The source of the eighth transistor 402 is configured to receive the fixed voltage $V_{DD}$ 110. The drain of the eighth transistor 402 is configured to provide as an output the signal $V_{bias}$. The signal $V_{bias}$ is further received as an input by the non-inverting input of the operational amplifier 404. The signal $V_{bias}$ is further received as an input by a first terminal of a third resistor 406 and a first terminal of a capacitor 408. The second terminal of the third resistor 406 and the second terminal of the capacitor 408 are coupled to ground 112.

In some embodiments, the voltage provided to the pre-driver $V_{bias}$ is regulated by the comparator circuit shown in FIG. 5 and the reference voltage $V_{ref}$ provided by the current source 118. When the reference voltage $V_{ref}$ is greater than the pre-driver voltage $V_{bias}$, the output voltage provided by the op-amp 404 is low which causes the p-type transistor 402 to switch on and the value of $V_{bias}$ increases to a value determined by the voltage drop across the transistor 402 and the capacitor 408 charges. When the value of $V_{bias}$ exceeds that of the reference voltage $V_{ref}$, the output voltage provided by the op-amp 404 switches to being a high voltage. This high output voltage causes the transistor 402 to switch off and the value of $V_{bias}$ decreases as the capacitor 408 discharges. Once the value of $V_{bias}$ has again fallen below the value of $V_{ref}$ the transistor 402 is switched on again and the capacitor is recharged.

In some embodiments, the low pass filer may be configured to remove at least some of the noise and/or transient variations from the reference voltage $V_{ref}$ such that their effect on the output of the comparator is reduced.

In some embodiments, the power control circuit 120 may reduce the source supply voltage received by the pre-drivers 102, 108. This may reduce the voltage swing of the transistors within the pre-driver and reduce the effect of these transistors operating further into their cut off region when switched off. This may reduce the delay to the device turning on. This may further result reducing the skew between the rising and falling transitions of the data.

In other words, by reducing the operating voltage of the pre-driver circuits, some embodiments may reduce the maximum drain-source voltage across the transistors within the pre-driver circuit. This may reduce the switch on time of the transistors within the pre-driver circuit because as the variation in the voltage when the transistor switched on and the voltage when the transistor is switched off is reduced, the time required to charge the intrinsic impedance present within the transistor also decreases.

FIG. 6 shows a schematic diagram of a pre-driver circuit which may be used in some embodiments to provide the first and second pre-driver circuits 102, 104.

The pre-driver circuit 600 comprises a ninth p-type transistor 602, the source of which is configured to receive the supply voltage $V_{bias}$. The gate of the ninth transistor 602 is configured to receive as an input the output provided by the drain of the ninth transistor 602. The output provided by the drain of the ninth transistor 602 is further received as an input by the source of a tenth p-type transistor 604.

The gate of the tenth transistor 604 is configured to receive as an input the one of the complementary signals to be transmitted, data in. The drain of the tenth transistor 604 is coupled to the drain of an eleventh n-type transistor 606. The gate of the eleventh transistor 606 is configured to receive as an input the same complementary signal to be transmitted. The source of the eleventh transistor 606 is coupled to ground 112. The signal to be transmitted, data out, is provided as an output by the node between the tenth transistor 604 and the eleventh transistor 606.

In some embodiments, a charge feed through reduction circuit configured to reduce the charge feed through from the pre-driver to the current steering switch may be provided by the ninth transistor 602. The charge feed through reduction circuit may reduce the risk of sudden jumps in the output voltage during switchover.

In some embodiments, the pre-driver final stage supply voltage may be curtailed by the charge feed through reduction circuit having a topology which is based on the supply range. In other words, in some embodiments the charge feed through reduction circuit may reduce the supply voltage provided to the pre-driver circuit. In some embodiments the charge feed through reduction circuit may be provided by at least one of a low drop out (LDO) circuit, at least one diode, or at least one transistor connected in series between the voltage supply 110 or power controller 120 and the pre-driver 102.

Figure 7:
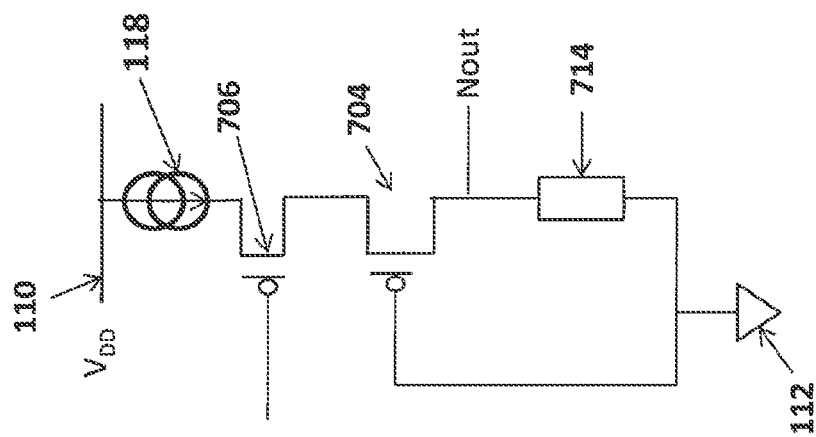
FIG. 7 shows a schematic diagram of a current steering switch in accordance with some embodiments.

FIG. 7 shows a current steering switch which may be used for at least one of the $P_{data}$ and/or the $N_{data}$ in accordance with some embodiments. A gate of a twelfth p-type transistor 706 is configured to receive as an input, the output provided by the current source 118. The drain of the twelfth transistor 706 is configured to provide as an output a signal which is received as an input by the source of a thirteenth p-type transistor 704. The gate of the thirteenth transistor 704 is coupled to ground. The drain of the thirteenth transistor 704 is configured to provide as an output output signal $N_{out}$. The output signal $N_{out}$ is also provided as an input to a first terminal of a fourth resistor 714. The second terminal of the fourth resistor is coupled to ground 112.

In some embodiments a biaser may be configured to bias the output signal, may be provided by the thirteenth transistor 702. In some embodiments, the thirteenth transistor 702 may remain switched on during the operation of the circuit. This may reduce range of the drain-source voltage available to the current steering switch when it is switched on and off. This may result in the current steering switch operating in the linear region during data transmission.

In some embodiments, the bias may be provided by at least one of at least one transistor and/or at least one diode.

In some embodiments the transistors may be n-type transistors or p-type transistors.

In some embodiments, the transistors may be complementary metal oxide semiconductor transistors, field effect transistors or bipolar junction transistors.

Some embodiments may use at least one of differential digital signal, Current Mode Logic and/or supply referred signalling.

Some embodiments may combine at least one of the modifications of FIGS. 5, 6 and 7 into the transmitter.

Various modifications to the embodiments described above will readily occur to the skilled person. The invention is not limited to these specific examples.

What is claimed is:

1. An apparatus comprising:
a plurality of current steering switches;
a power controller;
a current source having an output node coupled to the plurality of current steering switches and to the power controller, wherein the output node has a first voltage; and
a plurality of pre-drivers, wherein the power controller is configured to provide a second voltage to the plurality of pre-drivers, wherein the second voltage is dependent on the first voltage, and an increase in the second voltage corresponds to an increase in the first voltage.

2. The apparatus as claimed in claim 1, wherein the power controller is configured to maintain the second voltage at a substantially similar value to the first voltage.

3. The apparatus as claimed in claim 1, wherein the power controller comprises a comparator configured to enable a charging of a charging circuit configured to provide the second voltage.

4. The apparatus as claimed in claim 3, wherein the comparator is configured to enable the charging in dependence on a difference between the second voltage and the first voltage.

5. The apparatus as claimed in claim 1, wherein each of the current steering switches comprises a first biasing circuit configured to bias a respective output signal output by the current steering switch.

6. The apparatus as claimed in claim 5, wherein the first biasing circuit comprises a switch configured to reduce a voltage of the output signal.

7. The apparatus as claimed in claim 1, wherein each pre-driver comprises a reduction circuit configured to reduce a charge fed through the pre-driver.

8. The apparatus as claimed in claim 7, wherein each pre-driver comprises a switch between the reduction circuit and the power controller.

9. The apparatus as claimed in claim 1, wherein the current steering switches are configured to produce a current mode logic signal.

10. A system comprising:
a current mode logic transmitter;
a current mode logic receiver; and
an interface configured to couple the transmitter to the receiver;
wherein the current mode logic transmitter comprises:
a plurality of current steering switches;
a power controller;
a current source having an output node coupled to the plurality of current steering switches and to the power controller, wherein the output node has a first voltage; and
a plurality of pre-drivers, wherein the power controller is configured to provide a second voltage to the plurality of pre-drivers, wherein the second voltage is dependent on the first voltage, and an increase in the second voltage corresponds to an increase in the first voltage.

11. The system as claimed in claim 10, wherein the power controller comprises a comparator configured to enable a charging of a charging circuit configured to provide the second voltage.

12. The system as claimed in claim 10, wherein each of the current steering switches comprises a first biasing circuit configured to bias a respective output signal output by the current steering switch.

13. The system as claimed in claim 10, wherein each pre-driver circuit comprises a reduction circuit configured to reduce a charge fed through the pre-driver circuit.

14. An apparatus comprising:
a plurality of current steering switches;
a current source configured to provide a current to the plurality of current steering switches;
a plurality of pre-drivers; and
a power controller configured to provide a first voltage to the plurality of pre-drivers, wherein the first voltage is dependent on a second voltage provided to the current steering switches by the current source, and an increase in the first voltage corresponds to an increase in the second voltage.

15. The apparatus as claimed in claim 14, wherein the power controller comprises a comparator configured to enable a charging of a charging circuit configured to provide the first voltage.

16. The apparatus as claimed in claim 15 wherein the comparator is configured to enable the charging in dependence on a difference between the second voltage and the first voltage.

17. The apparatus as claimed in claim 14, wherein each of the current steering switches comprises a first biasing circuit configured to bias a respective output signal output by the current steering switch.

18. The apparatus as claimed in claim 17, wherein the first biasing circuit comprises a switch configured to reduce a voltage of the output signal.

19. The apparatus as claimed in claim 14, wherein each pre-driver circuit comprises a reduction circuit configured to reduce a charge fed through the pre-driver circuit.

20. The apparatus as claimed in claim 19, wherein the pre-driver circuit comprises a switch between the reduction circuit and the power controller.

21. An apparatus comprising:

a plurality of current steering switches;

a power controller;

a current source having an output node coupled to the plurality of current steering switches and to the power controller, wherein the output node has a first voltage; and a plurality of pre-drivers, wherein the power controller is configured to provide a second voltage to the plurality of pre-drivers, wherein the second voltage is dependent on the first voltage;

wherein the power controller comprises a comparator configured to enable a charging of a charging circuit configured to provide the second voltage, and wherein the comparator is configured to enable the charging in dependence on a difference between the second voltage and the first voltage.

22. The apparatus as claimed in claim 21, wherein the power controller is configured to maintain the second voltage at a substantially similar value to the first voltage.

23. The apparatus as claimed in claim 21, further comprising a current mode logic receiver.

24. The apparatus as claimed in claim 21, wherein each of the current steering switches comprises a first biasing circuit configured to bias a respective output signal output by the current steering switch.

25. The apparatus as claimed in claim 21, wherein each pre-driver comprises a reduction circuit configured to reduce a charge fed through the pre-driver.

\* \* \* \* \*